United States Patent [19]

Hershberger

[11] 4,134,074
[45] Jan. 9, 1979

[54] DYNAMIC TRANSIENT RESPONSE FILTER
[75] Inventor: David L. Hershberger, Quincy, Ill.
[73] Assignee: Harris Corporation, Cleveland, Ohio
[21] Appl. No.: 781,159
[22] Filed: Mar. 25, 1977
[51] Int. Cl.² ............................................. H03K 5/08
[52] U.S. Cl. .................................... 328/169; 328/149; 328/163
[58] Field of Search ............... 328/147, 149, 168, 169, 328/162, 163

[56] References Cited
U.S. PATENT DOCUMENTS

| 3,094,670 | 6/1963 | Batchelor | 328/168 X |
| 3,566,285 | 2/1971 | Schroeder | 328/169 |
| 3,866,151 | 2/1975 | Tajima et al. | 328/149 X |

Primary Examiner—John S. Heyman

[57] ABSTRACT
A filtering system for use in an FM modulating system. The filtering system provides frequency limiting of an input signal and does not overshoot amplitude limitations thereof. This filtering system includes a first filter and a second filter, separated by an overshoot compensator. The compensator modifies the output of the first filter in such a manner that, when the modified signal is filtered by the second filter, an output signal will be provided which does not overshoot a preselected amplitude. The overshoot compensator includes a threshold clipper which separates out any overshoot component generated by the first filter, an amplifier which amplifies the overshoot component, and a subtractor circuit which subtracts the amplified overshoot component from the output of the first filter to provide the modified signal. The second filter is of a type which provides a constant delay for all frequencies within the passband on the filtering system.

7 Claims, 4 Drawing Figures

DYNAMIC TRANSIENT RESPONSE FILTER

BACKGROUND AND FIELD OF THE INVENTION

The present invention relates to a filtering system, and more particularly to a scheme for low-pass filtering an amplitude limited signal without overshooting the predetermined amplitude constraints thereof. The system is specifically described with reference to FM stereo broadcasting.

In systems requiring both peak amplitude limiting and bandwidth limiting of a signal, problems arise in jointly meeting both of these requirements due to the tendency of a circuit providing either of these limitations to adversely effect the other limitation. Thus, a bandwidth limiting filter generally has a tendency to cause peak amplitude overshoots, whereas a peak amplitude limiting circuit has a tendency to produce spurious signals which will generally fall outside the bandwidth constraints. Because of this, regardless of which of the limitations is initially applied to the signal, in achieving the second limitation, the first will be lost.

This is particularly critical in FM stereo broadcasting, where the FCC has placed both bandwidth and modulation constraints on the signal to be broadcast. These requirements have generally been met in the past by reducing the amplitude level of the modulating signal to the point at which the overshoots caused by subsequent bandwidth limiting filters will not produce over-modulation of the broadcast signal. This can mean a sizeable reduction in modulation effectiveness, usually on the order of 2 ½ to 6 db.

It would thus be desirable to provide a system for frequency limiting an amplitude limited audio signal in such a manner that the average modulating level need not be reduced to prevent overshoot. An optimal system for performing this function must have a flat frequency response in the passband of the filter at all amplitude levels up to 100% modulation, must have a high attenuation of frequencies outside of the passband, must reduce over-modulation due to filter overshoot to an insignificant level, must not degrade the quality of the signal being processed, and must have insignificant THD and IM distortion at any modulating level of the 100%.

The present invention provides a new filtering technique that eliminates over-modulation due to amplitude overshoot while still meeting all of the above requirements.

In accordance with the present invention, apparatus is provided for filtering an amplitude limited signal. A first filter is responsive to the amplitude limited signal to produce a filtered signal which may include an amplitude overshoot component due to the filtering. An overshoot compensator is provided which is responsive to this filtered signal and which modifies the signal so as to provide a modified filtered signal which, when filtered for a second time, will produce a frequency limited signal which does not exceed predetermined amplitude constraints.

In accordance with the more limited aspect of the present invention, overshoot compensator means of a particular type is set forth. The overshoot compensator includes a threshold clipper which is responsive to the filtered signal for separating out the overshoot component from the filtered signal. Means are provided for increasing the amplitude of the overshoot component which has been separated from the filtered signal and for then subtracting this amplified component from the filtered signal so as to provide the modified signal.

BRIEF DESCRIPTION OF THE DRAWINGS

The foregoing and other objects and advantages of the present invention will become more readily apparent from the following description of the preferred embodiment, as taken in conjunction with the accompanying drawings which are a part hereof and wherein.

DETAILED DESCRIPTION

Figure 1:
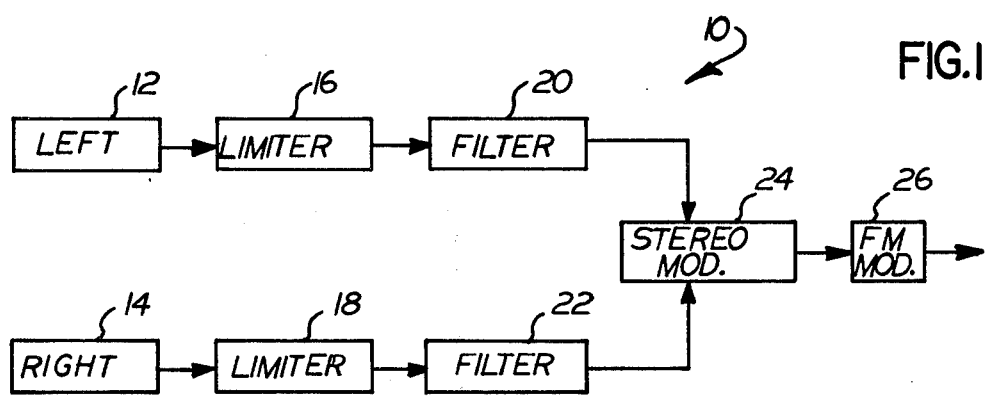
FIG. 1 is a general block diagram of an FM stereo broadcasting system in which the present invention could conveniently be employed.

Referring first to FIG. 1, there is shown an FM stereo broadcasting system of conventional form. Such a system would include a source of left and right audio signals 12 and 14. The signals produced by these audio signal sources would be directed in each case to limiting circuits 16 and 18 which would serve to hard-limit the amplitude of the audio signals to a specified level so as to limit modulation in accordance with FCC requirements. The output of limiters 16 and 18 could include various high frequency components due to the clipping action of the limiters. These signals would then in each case be directed to filters 20 and 22 which would serve to remove any signal component above 15 kHz, again to comply with FCC regulations. A stereo modulator 24 would be provided to frequency multiplex the signals together to form a composite signal. This composite signal would then be directed to an FM modulator 26 for FM modulation of a carrier signal.

If filters 20 and 22 are of conventional construction, then the amplitude of the signals provided thereby will in some cases overshoot the amplitude limitations provided by limiters 16 and 18, even though the input to the filters were accurately amplitude limited. This amplitude overshoot may result from two mechanisms. Filters 20 and 22 will generally provide different time delays for different frequency signals. If they are elliptic type filters, for example, then higher frequencies will generally experience a greater time delay in passage through the filter than will lower frequency signals. Because of this, the filter will alter the relative phase between various frequency components of the signals; this may cause the output signal to have a greater amplitude than the signal supplied by the limiter 16 and 18.

Consider, for example, the case of a square wave wherein only the fundamental and third harmonic components thereof fall within the passband of the filters. The first harmonic of the square wave, being of lower frequency, will generally experience a shorter time delay than will the third harmonic component. Therefore, although the peak amplitudes of the first and third harmonic components were separated in time at the input to the filter, they may become coincident at the filter's output. If this were to occur, the peak amplitudes of the first and third harmonics of the square wave would additively combine at the output of the filter to produce a signal having an amplitude which would overshoot the amplitude limitations imposed by limiters 16 and 18.

The second mechanism contributing to overshoot of signals results from the truncation of the frequency spectrum of the input signal. The first harmonic component of a sqaure wave signal has an amplitude which is approximately 27% greater than the amplitude of the square wave of which it is a component. The higher harmonic components serve to modify the fundamental (i.e., first harmonic) component to provide a composite signal having the form of a square wave. If the square wave input to the filter has a frequency such that the fundamental component alone falls within the passband of the filter, then this fundamental component will appear at the output unaltered by these higher frequency components. A sine wave having an amplitude 27% greater than the amplitude of the input square wave will then appear at the output of the filter. Square waves of this type may, however, be frequently generated either by the signal sources themselves, or by the limiting action of limiters 16 and 18.

As stated previously, the problem of filter overshoot was generally resolved in the prior art by reducing the audio levels to the point where overshoots "of frequent reoccurrence" did not exceed 100% modulation. The present invention provides a dynamic filter which accomplishes the filtering of the amplitude limited signals in such a manner as to substantially avert overshoot.

Figure 2:
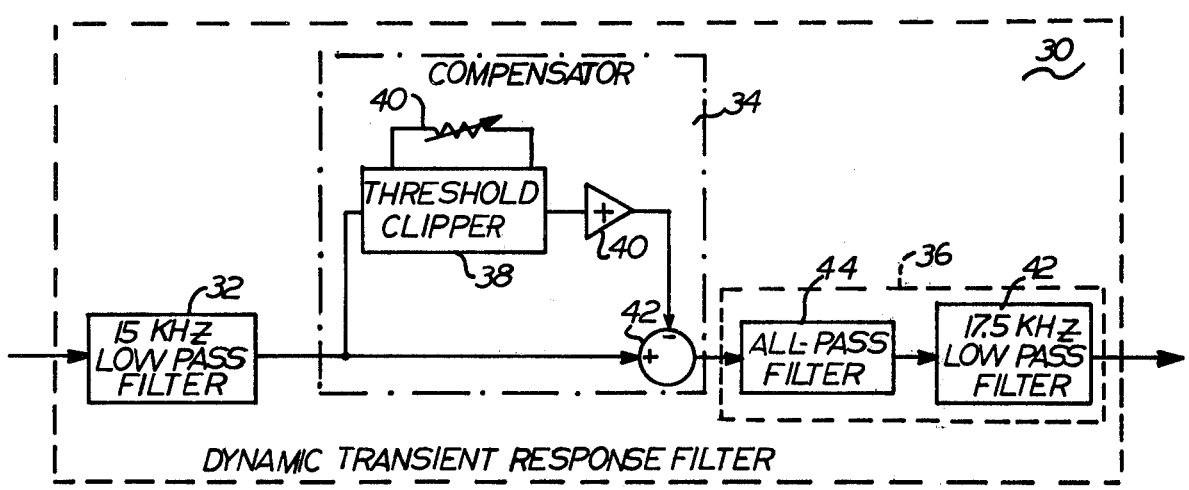
FIG. 2 is a general block diagram of a dynamic transient response filter in accordance with the teachings of the present invention.

In FIG. 2 there is shown a dynamic, transient response filter in accordance with the principles of the present invention. A filter having this form will preferably be provided in each of the audio channels in place of conventional filters 20 and 22. The dynamic transient response filter 30 includes a filter 32 which may be of conventional design and could, for example, be a seventh order elliptic-type filter with a cut-off frequency of 15 kHz. It will be appreciated that this filter will overshoot occasionally as a result of the mechanisms described above with respect to prior art filters 20 and 22.

The present invention thus additionally includes a compensator 34 and a uniform time delay filter 36. Since the passband of filter 36 is designed to be substantially similar to the passband of filter 32, and since filter 36 has a uniform time delay for all frequencies within the passband of filter 32, the first filter may be considered to "predict" the output of the second filter. This is, if the first filter overshoots, the second filter will also overshoot, while if the first filter does not overshoot, the second filter will not overshoot. A compensator 34 is thus provided which anticipates overshoot of filter 36 on the basis of overshoot of filter 32, and which modifies the signal in such a manner that this overshoot does not take place. This compensator functions only when the first filter overshoots, and is otherwise passive, having no effect upon the signal.

Compensator 34 includes a threshold clipper 38 which compares the amplitude of the signal supplied by filter 32 with a predetermined amplitude limitation established by a potentiometer 40. This threshold clipper 38 will supply an output corresponding to the portion of the signal supplied by filter 32 which overshoots the amplitude limitations set by potentiometer 40. Thus, the output of threshold clipper 38 will remain at a zero level unless the output of filter 32 exceeds this amplitude limitation. The clipping threshold will preferably be calibrated to correspond to the limiting amplitude set into limiters 16 and 18. In this manner, the threshold clipper will operate to separate out the overshoot component from the output of filter 32. In the event that an overshoot does occur, the output of threshold clipper 38 will respond linearly to only the overshoot portion of a signal, i.e., that portion of the signal which exceeds the clipping threshold established by potentiometer 40. The clipper 38 will not respond to any other portion of the signal.

The output of threshold clipper 38 is directed to an amplifier 42 which serves to increase by a fixed amount the amplitude of the overshoot components separated out by threshold clipper 38. It has been found that amplifier 40 should preferably be provided with a gain of approximately 1.85 for optimum operation. The amplified overshoot components supplied by amplifier 40 are then directed to a subtractor circuit 42 which serves to subtractively combine the output of filter 32 with the amplified overshoot components provided by amplifier 40. This process serves to provide the output of filter 32 with a component which will combine with, and substantially cancel, the overshoot component which would otherwise appear at the output of filter 36. Consequently, when the modified signal is filtered by filter 36, the output thereof will also be modified so that substantially no overshoot results.

Constant time delay filter 36 may conveniently include two components; a filter 42 of conventional design, and an allpass filter 44 which serves to pass all frequencies without attenuation, but which provides a phase delay designed to compensate for the phase delay provided by conventional filter 42. Filter 42 may be a seventh order elliptic-type, similar to filter 32. The phase characteristics of filters of this nature can be extremely nonlinear near the cut-off frequency. Consequently, in order to simplify the design of phase equalizer 44, the passband of filter 42 is extended from 15 kHz to 17.5 kHz so that the linear phase portion of filter 42 extends through the passband of filter 32. When thus constructed, the combination of all-pass filter 44 and low-pass filter 42 presents an approximation to a uniform time delay (e.g., 100 microseconds) between DC and 15 kHz.

Figure 3:
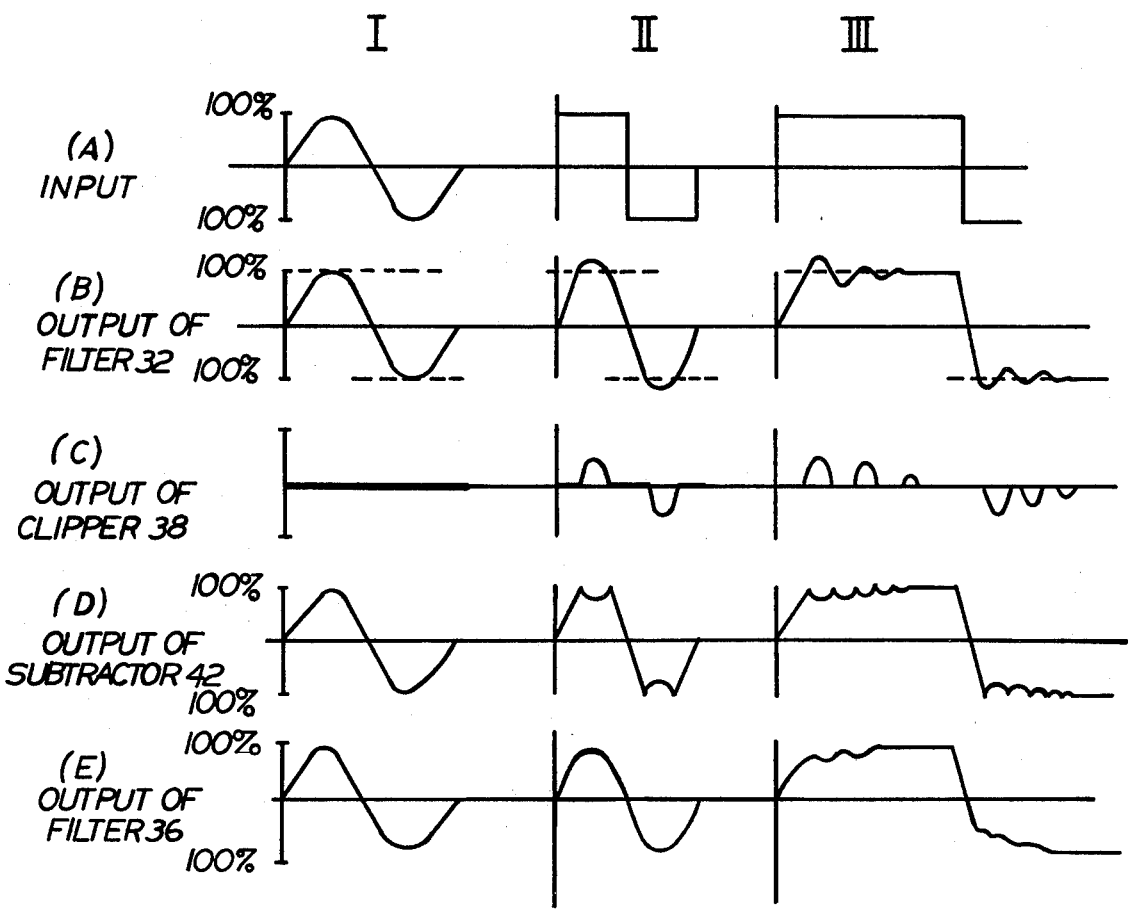
FIG. 3 provides graphic illustrations of waveforms associated with the dynamic transient response filter of FIG. 2 for various input conditions; and, FIG. 4 is a general block diagram of the dynamic transient response filter of FIG. 2 including further components to even more completely reduce overshoot.

The operation of this circuit can be more readily understood through reference to FIG. 3, wherein the signals at various places in the dynamic transient response filter are shown for three input signals, identified by Roman Numerals I, II, and III. Referring first to Case I, an input signal is provided having a substantially sinusoidal form, and which falls within the passband of filter 32. The amplitude of this signal is substantially at the 100% modulation level, so that no overshoot may be tolerated. Since the frequency of this signal is within the passband filter 32, and since the signal includes no higher harmonics, the output of filter 32 will correspond exactly with the input thereto. Since no overshoot component will be produced, the output of threshold clipper 38 will remain at a zero voltage level. Because of this, no signal will be subtracted from the output of filter 32 by subtractor 42, thus the output of subtractor 42 will correspond exactly to the input signal shown in FIG. 3a-I. Since this signal is also within the passband of filter 36, no modification of this signal will be produced by this filter, either, and the output signal, shown in FIG. 3e-I, will correspond precisely to the input signal shown in FIG. 3a.

In Case II, a square wave having a 100% modulation amplitude and a frequency within the passband of filter 32 is provided. This signal has such a frequency that only the fundamental component of the square wave will fall within the passband of filter 32. The output of filter 32 (FIG. 3b-II) will thus correspond to only this fundamental component of the square wave, and will overshoot by approximately 27%. Threshold clipper 38 will nonlinearily respond to this output signal to provide a signal (FIG. 3c-II) corresponding to only the overshoot portion of the output of filter 32. This signal, as amplified by amplifier 40, will be subtracted from the output signal supplied by filter 32 to provide a modified signal shown In FIG. 3d-II. This modified signal, when further filtered by a second filter 36, will correspond to the signal shown in FIG. 3e-II. It will be seen that this signal does not overshoot the 100% modulation level.

In Case III, a square wave having a much lower frequency is shown. When this signal is directed to filter 32, the output signal (shown in FIG. 3b-III) will have a significant "ringing" component. Since the peaks of this ringing component exceed the 100% modulation level, the outputs of threshold clipper 38 will be as shown in FIG 3c-III. When subtracted from the output of filter 32 by subtractor 42, the signal shown in FIG. 3d-III will be produced, which, when finally filtered by second filter 36 will produce the signal shown in FIG. 3e-III, which does not overshoot.

Figure 4:
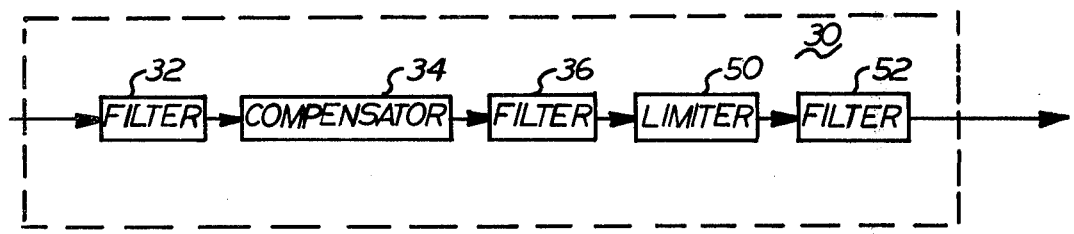

Referring now to FIG. 4, a further refinement of the present invention is illustrated. It is thus shown in FIG. 4 that the dynamic transient response filter 30 may also include an instantaneous limiter 50 and a one-pole, low-pass filter 52. Limiter 50 and low-pass filter 52 are provided because the dynamic transient response filter of FIG. 2 will occasionally overshoot by a few percent. With the inclusion of instantaneous limiter 50 and one-pole, low-pass filter 52, however, a combined filtering system is provided which does not overshoot.

It will thus be appreciated that a filtering system has been described which has a flat frequency response in a selected passband at all levels up to 100% modulation, and which has a high attenuation of frequencies outside of the passband. The system also supresses overshoot components to an insignificant level so as to thereby avoid overmodulation, and has a very low total harmonic distortion and IM distortion at any level up to 100% modulation.

Although the invention has been described with respect to a preferred embodiment, it will be appreciated that various alterations and arrangement of parts may be made without departing from the spirit and scope of the invention, as defined in the appended claims.

What is claimed is:

1. Apparatus for frequency limiting an amplitude limited signal without exceedng predetermined amplitude constraints, comprising:
   first filter means responsive to said amplitude limited signal for providing a frequency limited signal having an amplitude which may overshoot said amplitude constraints;
   compensator means responsive to amplitude overshoot of said frequency limited signal for modifying said frequency limited signal so as to substantially avert overshoot of a subsequent filter means which is responsive to the modified signal; and,
   second filter means responsive to said modified signal for frequency limiting said signal to provide a frequency limited signal having an amplitude which substantially does not exceed said predetermined amplitude constraints.

2. Apparatus as set forth in claim 1 wherein said compensator means comprises: threshold clipper means responsive to said frequency limited signal having an amplitude which may overshoot said amplitude constraints, for providing an output signal which is responsive to only that portion of said frequency limited signal which exceeds said amplitude constraints; amplifier means for increasing the gain of said output signal to provide an amplified output signal; and signal subtractor means for subtracting said amplified output signal from said frequency limited signal having an amplitude which may overshoot said amplitude constraints to thereby provide said modified signal.

3. Apparatus as set forth in claim 1 wherein said second filter means comprises filter means having a constant time delay for all frequencies within the passband of said first filter means.

4. Apparatus as set forth in claim 3 wherein said filter means having a constant time delay comprises elliptical filter means having a time delay which is substantially linearly related to frequency for all frequencies within the passband of said first filter means, and phase equalizer means having a time delay characteristic which is designed to compensate for the nonconstant time delay characteristic of said elliptical filter means such that the combined time delay characteristic of said second filter means is substantially constant for all frequencies within the passband of said first filter means.

5. Apparatus as set forth in claim 1 and further comprising instantaneous limiter means responsive to said frequency limited signal supplied by said second filter means for amplitude limiting said signal so as to thereby eliminate any residual amplitude overshoot therefrom.

6. Apparatus as set forth in claim 5 and further comprising one-pole low-pass filter means for filtering the output of said instantaneous limiter means.

7. Apparatus for amplitude and frequency limiting the audio signals used for modulating an FM modulator and comprising:
   first filter means responsive to an audio signal for providing a frequency limited signal having an amplitude which may overshoot predetermined amplitude constraints;
   compensator means responsive to amplitude overshoot of said frequency limited signal for modifying said frequency limited signal so as to substantially avert overshoot of a subsequent filter means which is responsive to the modified signal, said compensator means including means for providing a modified signal corresponding generally to said frequency limited signal except that those signal portions which exceeded said predetermined amplitude constraints have been inverted to provide signal cusps rather than signal peaks; and
   second filter means responsive to said modified signal for frequency limiting said signal to provide a frequency limited signal having an amplitude which substantially does not exceed said predetermined amplitude constraints.

* * * * *